(12) United States Patent
Beach et al.

(10) Patent No.: US 7,564,110 B2
(45) Date of Patent: Jul. 21, 2009

(54) ELECTRICAL LAPPING GUIDES MADE FROM TUNNELING MAGNETORESISTIVE (TMR) MATERIAL

(75) Inventors: Robert S. Beach, Los Gatos, CA (US); Daniele Mauri, San Jose, CA (US); David J. Seagle, Morgan Hill, CA (US); Jila Tabib, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/379,321

(22) Filed: Apr. 19, 2006

(65) Prior Publication Data

US 2007/0246761 A1 Oct. 25, 2007

(51) Int. Cl.
*H01L 29/82* (2006.01)
(52) U.S. Cl. ............... 257/427; 257/421; 257/E43.004; 365/158
(58) Field of Classification Search .................. 257/421, 257/422, 427, E43.004, E29.167, E29.323; 365/66, 158
See application file for complete search history.

(56) References Cited

U.S. PATENT DOCUMENTS

| | | | |
|---|---|---|---|
| 4,914,868 A | 4/1990 | Church et al. | |
| 6,609,948 B1 | 8/2003 | Fontana, Jr. et al. | |
| 6,684,171 B2 | 1/2004 | Church et al. | |
| 7,230,802 B2 * | 6/2007 | Freitag et al. | 360/324.12 |
| 2004/0180608 A1 | 9/2004 | Church et al. | |
| 2006/0187705 A1 * | 8/2006 | Nakamura et al. | 365/171 |
| 2007/0217088 A1 * | 9/2007 | Freitag et al. | 360/324.12 |

* cited by examiner

*Primary Examiner*—Matthew E Warren
(74) *Attorney, Agent, or Firm*—Duft Bornsen & Fishman, LLP

(57) ABSTRACT

Tunneling magnetoresistive (TMR) electrical lapping guides (ELG) are disclosed for use in wafer fabrication of magnetic sensing devices, such as magnetic recording heads using TMR read elements. A TMR ELG includes a TMR stack comprising a first conductive layer, a barrier layer, and a second conductive layer of TMR material. The TMR ELG also includes a first lead and a second lead that connect to conductive pads used for applying a sense current to the TMR ELG in a current in plane (CIP) fashion. The first lead contacts one side of the TMR stack so that the first lead contacts both the first conductive layer and the second conductive layer of the TMR stack. The second lead contacts the other side of the TMR stack so that the second lead contacts both the first conductive layer and the second conductive layer of the TMR stack.

11 Claims, 6 Drawing Sheets

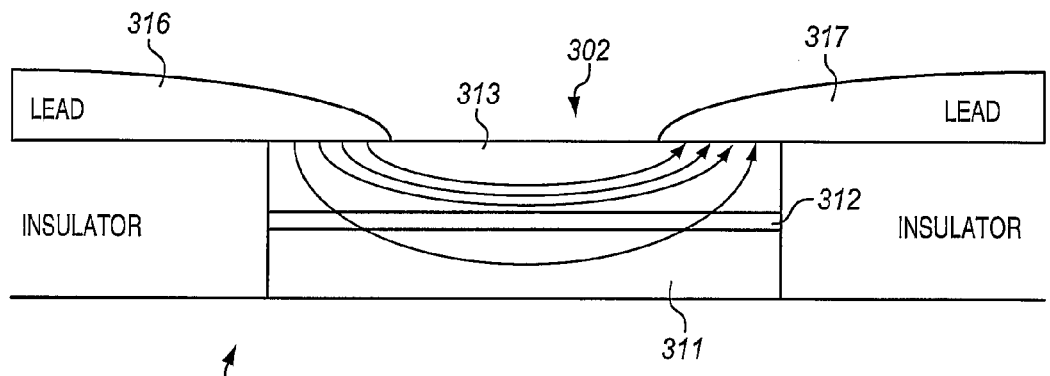
FIG. 7
PRIOR ART
FIG. 8
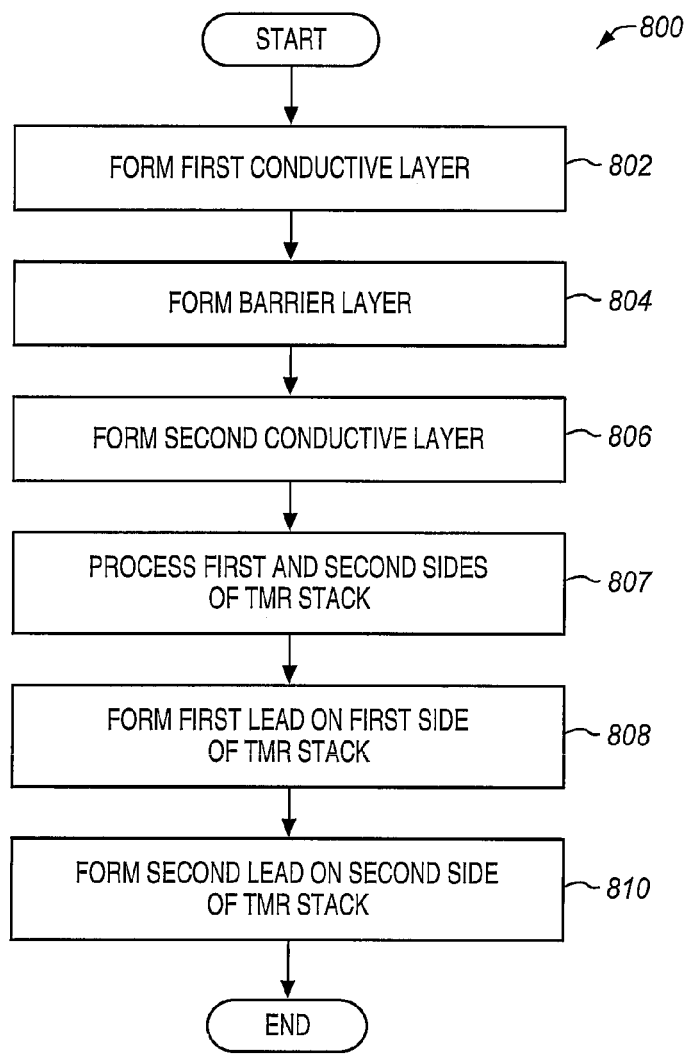

ELECTRICAL LAPPING GUIDES MADE FROM TUNNELING MAGNETORESISTIVE (TMR) MATERIAL

BACKGROUND OF THE INVENTION

1. Field of the Invention

The invention is related to the field of magnetic sensing devices and, in particular, to electrical lapping guides (ELG) made from tunneling magnetoresistive (TMR) material that are used in the fabrication of the magnetic sensing devices.

2. Statement of the Problem

Many computer systems use magnetic disk drives for mass storage of information. Magnetic disk drives typically include one or more recording heads (sometimes referred to as sliders) that include read elements and write elements. A suspension arm holds a recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passes over the transitions, the magnetic fields of the transitions modulate the resistance of the read element. The change in resistance of the read element is detected by passing a sense current through the read element and then measuring the change in voltage across the read element. The resulting signal is used to recover the data encoded on the track of the magnetic disk.

Recording heads are typically manufactured on a substrate wafer that includes an array of recording heads. FIG. 1 illustrates a wafer 100 of recording heads in the prior art. The recording heads are arranged in rows on wafer 100. The dotted lines on FIG. 1 illustrate parting lines defining planes normal to the wafer plane, which will define the ABS of the recording heads. Wafer 100 is separated into rows of recording heads along the parting lines illustrated in FIG. 1. The rows are rough lapped from the ABS side of the recording heads to remove many microns of material to a desired rough lapping depth. The rows are then finally lapped to the final target forms using finer lapping plates. The final lapping process creates a desired stripe height of the read elements in the recording heads. The stripe height provides a desired magnetic characteristic for the read element in each recording head.

During the lapping process, a sense current may be passed through the read elements in the recording heads to monitor the lapping depth. The resistances of the read elements indicate the stripe height and may be used to control the depth of the lapping process. Lapping sensors called electrical lapping guides (ELG) may also be used to control the depth of the lapping process. If used, the ELGs are fabricated in the recording heads themselves or in the kerfs of wafer 100 between the recording heads.

FIG. 2 illustrates a row 200 of recording heads 202 that has been separated from wafer 100 in the prior art. The ABS of row 200 is the top surface 201 as shown in FIG. 2. Row 200 includes a plurality of recording heads 202. Each recording head 202 includes a read element 205, such as a magnetoresistive (MR) read element or a tunneling MR (TMR) read element. One or more ELGs 206 are also fabricated in the recording heads 202. The positioning of the ELGs 206 relative to the read elements 205 allows the ELGs 206 to control the lapping depth of row 200. As row 200 is lapped from the ABS 201, the resistances of ELGs 206 change. The resistances of ELGs 206 are related to the stripe height of read elements 205.

ELGs 206 may be formed from the same materials as read elements 205 in the same fabrication steps. For instance, one type of read element 205 is a TMR read element. A TMR read element, or magnetic tunnel junction (MTJ) read element, comprises first and second ferromagnetic layers separated by a thin, electrically insulating, tunnel barrier layer. The tunnel barrier layer is sufficiently thin that quantum-mechanical tunneling of charge carriers occurs between the ferromagnetic layers.

FIG. 3 illustrates an ELG 206 in row 200 formed from TMR material in the prior art. The ABS relative to ELG 206 is the plane of the paper of FIG. 3. By being formed from TMR material, ELG 206 includes a TMR stack 302 comprised of a first conductive (ferromagnetic) layer 311, a barrier layer 312, and a second conductive (ferromagnetic) layer 313. The layers 311-313 of ELG 206 are formed in the same deposition and lift-off steps as the layers of the read elements 205 (see FIG. 2). ELG 206 also includes leads 316-317 that connect to conductive pads (not shown) on the recording heads 202 (see FIG. 2). Leads 316-317 are deposited after layers 311-313 are deposited and contact the top of conductive layer 313. Leads 316-317 are connected in a current in plane (CIP) fashion for applying the sense current to ELG 206.

There are problems using TMR read elements or TMR ELGs as lapping guides. As is illustrated in FIG. 3, the barrier layer 312 separating the two conductive layers 311 and 313 is very thin, on the order of 10 Å. Because of the thinness of barrier layer 312, the lapping process (which is into the page in FIG. 3) can easily smear one of the conductive layers 311 across barrier layer 312 into the other conductive layer 313 causing a short between conductive layers 311 and 313. When conductive layers 311 and 313 are shorted across barrier layer 312, the resistance of ELG 206 can change dramatically. The changing resistance of ELG 206 unfortunately leads to ambiguity as to the desired stripe height and when to stop the lapping process.

To avoid this problem, a simple metallic material with low magnetoresistance, such as Ta or NiFe, has been used for ELGs instead of TMR material. However, there are other problems associated with using non-magnetic material for ELGs instead of TMR material. One problem is that there may be uncertainties in the definition of the back edge of the non-TMR ELGs relative to the TMR read element due to the variation in milling rates between the TMR read element and the ELG material. Another problem may be increased cost and increased cycle time. Additional fabrication steps are needed to form the non-TMR ELGs. For instance, during fabrication of a wafer, a full film of TMR material is deposited. A photoresist is then deposited to protect the TMR material of the TMR read elements. The wafer is then milled in the regions of the ELGs. The non-TMR material is then deposited to fill the holes milled for the ELGs. A liftoff process is then performed to lift off the ELG material and the photoresist. These additional steps of fabricating the non-TMR ELGs are undesirable.

SUMMARY OF THE SOLUTION

The invention solves the above and other related problems by using a TMR ELG where the leads of the TMR ELG connect to both of the conductive layers of the TMR ELG. By connecting each of the leads to both conductive layers of the TMR ELG, the potential of both conductive layers is the same. If there is a smearing of the conductive layers across the barrier layer, there is no current flow across the barrier layer because there is no potential difference between the conductive layers. Advantageously, shorting across the barrier layer will not cause a resistance change in the ELG. The ELG can thus more accurately indicate the stripe height of the TMR elements during the lapping process. Also, because the ELG is formed from TMR material, the additional fabrication steps of forming a non-TMR ELG can be avoided.

One embodiment of the invention comprises a TMR ELG used in wafer fabrication of magnetic sensing devices, such as magnetic recording heads. The TMR ELG includes a TMR stack comprising a first conductive layer, a barrier layer, and a second conductive layer. The TMR ELG also includes a first lead and a second lead that connect to conductive pads used for applying a sense current to the TMR ELG in a current in plane (CIP) fashion. The first lead contacts a first side of the TMR stack so that the first lead contacts both the first conductive layer and the second conductive layer of the TMR stack. The second lead contacts a second side of the TMR stack, opposite the first side, so that the second lead contacts both the first conductive layer and the second conductive layer of the TMR stack.

Another embodiment comprises a method of fabricating a TMR ELG. A first conductive layer of a TMR stack is formed, a barrier layer of the TMR stack is formed on the first conductive layer, and a second conductive layer of the TMR stack is formed on the barrier layer. The above forming steps may be full film depositions of TMR material on a wafer. After the TMR stack is formed, areas on either side of the TMR stack may be milled or otherwise processed for the leads. A first lead is then formed on a first side of the TMR stack and contacts both the first conductive layer and the second conductive layer of the TMR stack. A second lead is formed on a second side of the TMR stack, and contacts both the first conductive layer and the second conductive layer of the TMR stack. The first and second leads may be formed in the same fabrication step in a full film deposition of the lead material.

The invention may include other exemplary embodiments described below.

DESCRIPTION OF THE DRAWINGS

The same reference number represents the same element on all drawings.

FIG. 7 illustrates a current flow through a prior art TMR ELG.

FIGS. 8-9 illustrate methods of fabricating TMR ELGs in exemplary embodiments of the invention.

DETAILED DESCRIPTION OF THE INVENTION

FIGS. 4-6 and 8-10 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
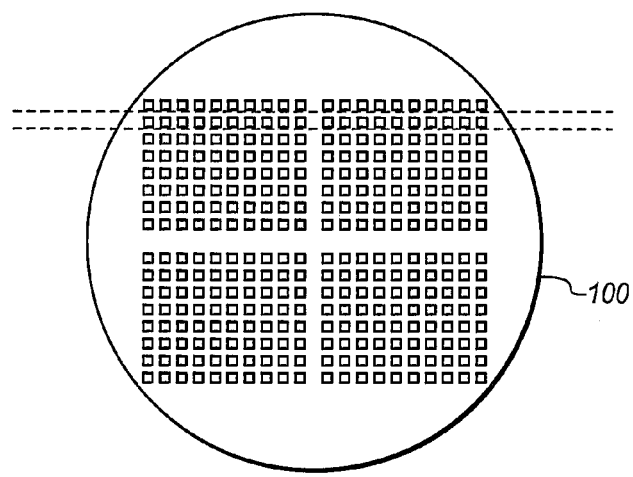
FIG. 1 illustrates a wafer of recording heads in the prior art.
Figure 2:
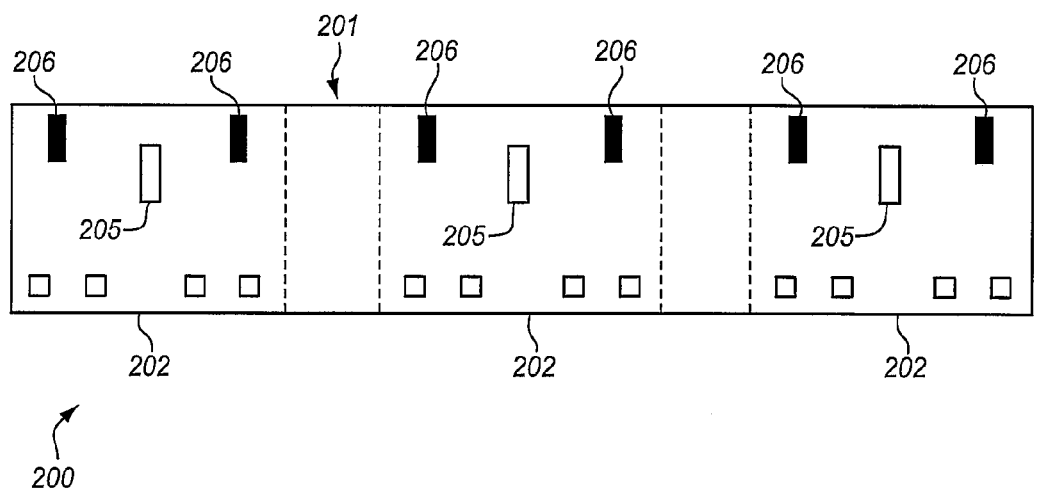
FIG. 2 illustrates a row of recording heads that has been separated from a wafer in the prior art.
Figure 4:
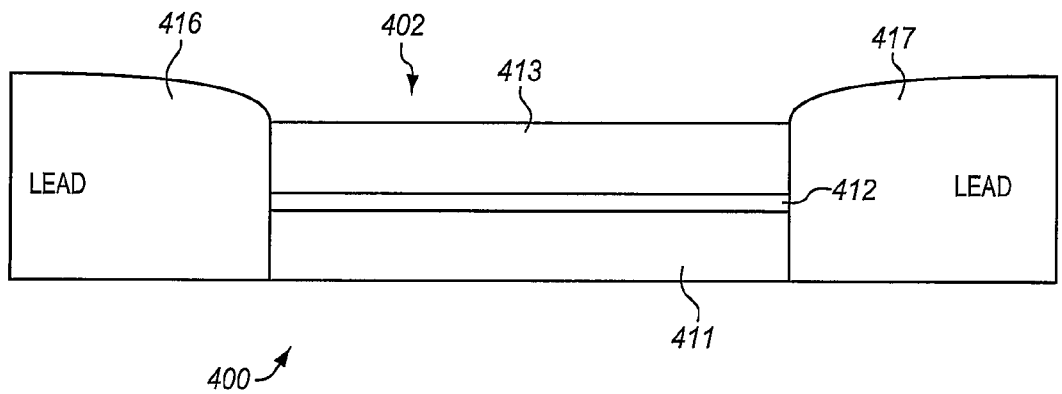
FIG. 4 illustrates a TMR ELG in an exemplary embodiment of the invention.
Figure 10:
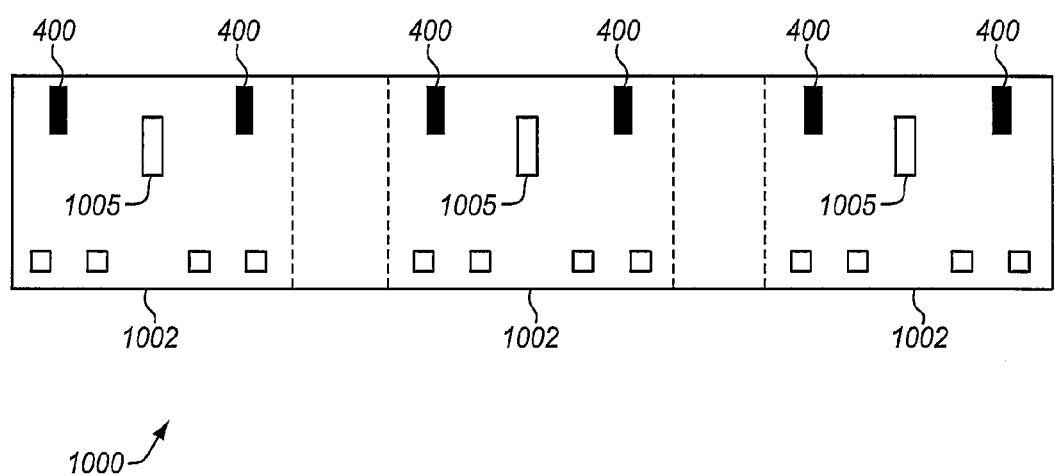
FIG. 10 illustrates a row of magnetic sensing devices in an exemplary embodiment of the invention.

FIG. 4 illustrates a TMR ELG 400 in an exemplary embodiment of the invention. TMR ELG 400 is used for control of a lapping process of magnetic sensing devices having TMR elements. Magnetic sensing devices comprise any devices that sense magnetic fields based on TMR properties. The magnetic sensing devices may be formed in a wafer that includes rows of magnetic sensing devices, such as is illustrated in FIG. 1. FIG. 10 illustrates a row 1000 of magnetic sensing devices 1002. Although row 1000 shows three magnetic sensing devices 1002, a typically row may include more or less magnetic sensing devices 1002. Magnetic sensing devices 1002 each include a TMR element 1005. One example of a magnetic sensing device is a magnetic recording head having a TMR read element. One or more TMR ELGs 400, as in FIG. 4, is fabricated in magnetic sensing devices 1002 as shown in FIG. 10. Although two TMR ELGs 400 are shown in each magnetic sensing device 1002, more or less TMR ELGs 400 may be used as desired. One or more TMR ELGs 400 may additionally or alternatively be fabricated between the magnetic sensing devices 1002 in the kerfs. The positioning of the TMR ELGs 400 relative to the magnetic sensing devices 1002 may vary based on the desires of the fabricator. The leads for TMR ELGs 400 are not shown in FIG. 10, as there may be many different ways to provide connection points to TMR ELGs 400 via the leads.

In FIG. 4, the view of TMR ELG 400 is from the ABS side that will be subsequently lapped. TMR ELG 400 includes TMR stack 402 comprising a first conductive (ferromagnetic) layer 411, a barrier layer 412, and a second conductive (ferromagnetic) layer 413. Conductive layer 411 and conductive layer 413 are both metallic layers that are more conductive than barrier layer 412. For instance, conductive layers 411 and 413 may be comprised of NiFe or similar material. Barrier layer 412 may be comprised of aluminum oxide or similar material. Conductive layer 411 may correspond with a free layer of a TMR element. Barrier layer 412 may correspond with a barrier layer of a TMR element. Conductive layer 413 may correspond with a pinned layer of a TMR element. There may be other layers of TMR ELG 400 that are known to those skilled in the art.

TMR ELG 400 also includes leads 416-417 that connect to conductive pads on one or more of the magnetic sensing devices 1002 to apply a sense current to TMR ELG 400 in a current in plane (CIP) fashion (see also FIG. 10). Lead 416 is illustrated on the left side of FIG. 4 and contacts the left side of TMR stack 402. Lead 416 is deposited to contact both conductive layer 411 and conductive layer 413 on the left side of TMR stack 402. Lead 417 is illustrated on the right side of FIG. 4 and contacts the right side of TMR stack 402. Lead 417 is deposited to contact both conductive layer 411 and conductive layer 413 on the right side of TMR stack 402. Those skilled in the art understand which sides of the TMR stack 402 that leads 416-417 are to contact to provide a CIP sense current.

If a potential is applied across leads 416-417 for a sense current, the potential is the same between conductive layer 411 and 413 along the length of layers 411 and 413 because leads 416-417 contact both layers 411 and 413. Unlike prior TMR ELGs where the leads contact only one of the conductive layers (see FIG. 3), leads 416-417 contact both conductive layers 411 and 413 causing a common potential between the two layers.

Figure 5:
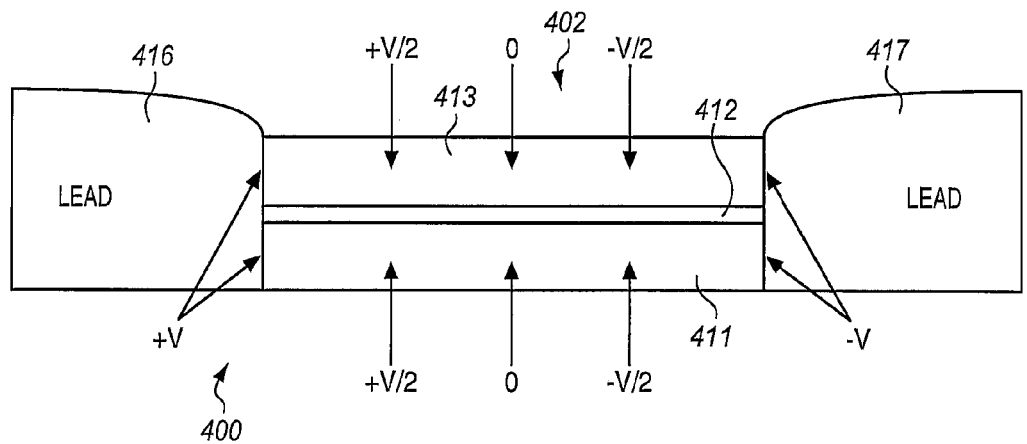
FIG. 5 illustrates the potential distribution along a TMR ELG in an exemplary embodiment of the invention.

FIG. 5 illustrates the potential distribution along TMR ELG 400 in an exemplary embodiment of the invention. At the left side of TMR stack 402, there is a potential of +V on both conductive layer 411 and conductive layer 413. Between the left side of TMR stack 402 and the middle of TMR stack 402, there is a potential of +V/2 on both conductive layer 411 and conductive layer 413. In the middle of TMR stack 402, there is no potential on either conductive layer 411 or conductive layer 413. Between the middle of TMR stack 402 and the right side of TMR stack 402, there is a potential of −V/2 on both conductive layer 411 and conductive layer 413. At the right side of TMR stack 402, there is a potential of −V on both conductive layer 411 and conductive layer 413.

As is illustrated in FIG. 5, the potential on conductive layer 411 and on conductive layer 413 are the same at each point along the length of the TMR ELG 400. Even if conductive layer 411 or conductive layer 413 is smeared across barrier layer 412 during the lapping process, there is no potential drop across barrier layer 412 along the entire length of TMR ELG 400. There is no current flow from conductive layer 411 to conductive layer 413 (and vice versa) along the entire length of TMR ELG 400. If conductive layers 411 and 413 are shorted across barrier layer 412 during the lapping process, there will be no current redistribution. The shorting thus does not change the resistance of TMR ELG 400.

Figure 6:
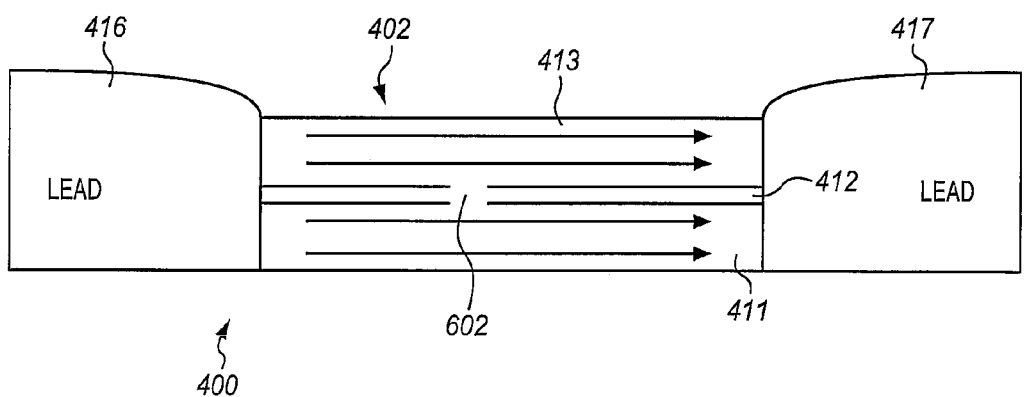
FIG. 6 illustrates a current flow through a TMR ELG in an exemplary embodiment of the invention.

FIG. 6 illustrates a current flow through TMR ELG 400 in an exemplary embodiment of the invention. A potential is applied across leads 416-417 causing current to flow from left to right through TMR stack 402 parallel to the major planes of TMR stack 402. Assume that there is a short 602 (smear) from conductive layer 411 to conductive layer 413 across barrier layer 412. Because the potential on conductive layer 411 and the potential on conductive layer 413 are the same at the point of short 602, current traveling through conductive layer 411 does not travel into conductive layer 413 through short 602, and vice-versa. Because there is no current redistribution, the resistance of TMR ELG 400 does not change when short 602 occurs during lapping.

Figure 3:
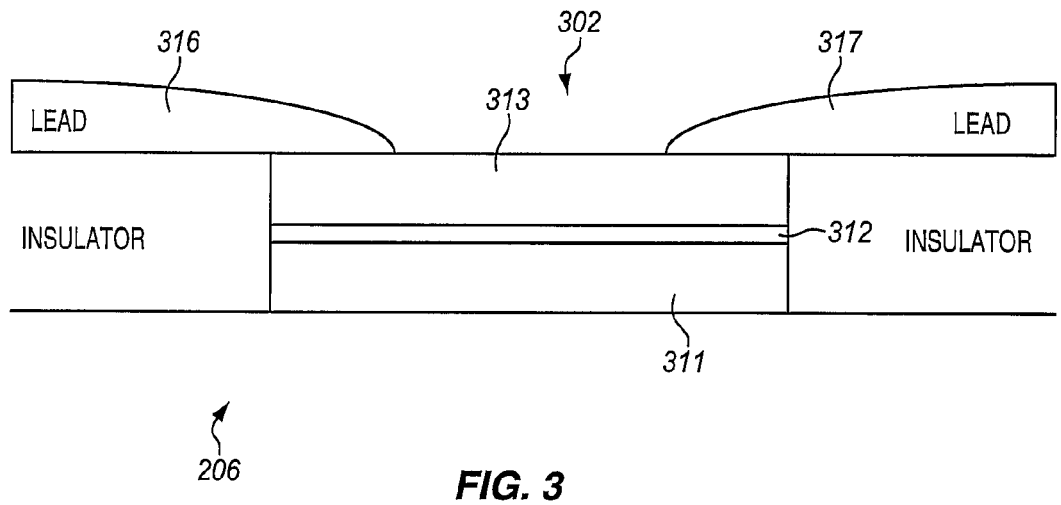
FIG. 3 illustrates an ELG formed from TMR material in the prior art.

In comparison to the current flow through TMR ELG 400, FIG. 7 illustrates a current flow through a prior art TMR ELG 206 (see FIG. 3). As described in the background, prior TMR ELGs 206 included leads 316-317 that contact only the top conductive layer 313 of the TMR stack 312. A potential is applied across leads 316-317 causing current to flow from left to right through the TMR stack 3 12 parallel to the major planes of TMR stack 312. A large amount of the sense current (illustrated by arrows) travels from lead 316 to lead 317 through the top conductive layer 313. Only a small amount of the sense current travels from lead 316 to lead 317 through the bottom conductive layer 311. The sense current that travels through the bottom conductive layer 311 has to cross barrier layer 312 which is more resistive than conductive layers 311 and 313. If there is a short (smear) from conductive layer 311 to conductive layer 313 across the barrier layer 312, then a larger amount of the sense current flows through the bottom conductive layer 311 than before. The short unfortunately changes the overall resistance of the TMR ELG 206, which does not happen using the lead contact structure shown in FIG. 4.

Figure 9:
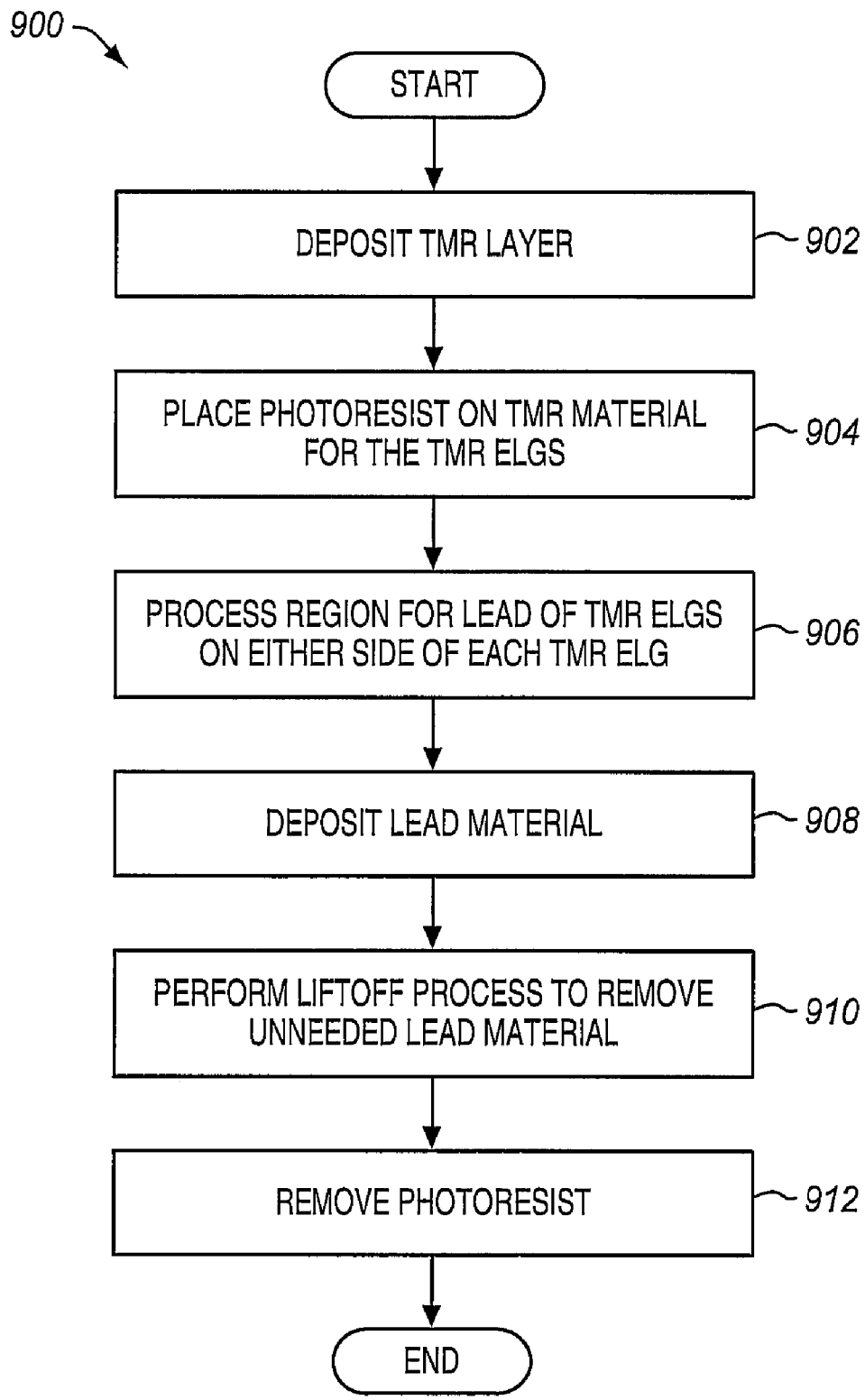

There may be many desired methods of fabricating TMR ELG 400 illustrated in FIG. 4. FIGS. 8-9 illustrate two possible methods of fabricating TMR ELG 400 in exemplary embodiments of the invention. Because other methods may be used as desired, the invention is not limited to the methods discussed below.

FIG. 8 is a flow chart illustrating one method 800 of fabricating TMR ELG 400. Method 800 is described as forming a single TMR ELG 400, but method 800 may also be extended to forming a wafer of magnetic sensing devices. In step 802, the first conductive layer 411 of TMR stack 402 is formed (see also FIG. 4). In step 804, the barrier layer 412 of TMR stack 402 is formed on conductive layer 411. In step 806, the second conductive layer 413 of the TMR stack 402 is formed on barrier layer 412. Those skilled in the art understand that steps 802, 804, and 806 may be performed as a full film deposition of TMR material on a wafer. Method 800 may include other steps of forming other layers of TMR stack 402 as desired.

In step 807, a first side and a second side TMR stack 402 are milled or otherwise processed for leads 416-417. Processing step 807 exposes both conductive layer 411 and conductive layer 413 on either side of TMR stack 402. In step 808, a first lead 416 is formed on the first side of TMR stack 402. Lead 416 as formed contacts both conductive layer 411 and conductive layer 413. In step 810, a second lead 417 is formed on the second side of TMR stack 402. Lead 417 as formed contacts both conductive layer 411 and conductive layer 413. Lead 416 and lead 417 may be formed in the same fabrication step as a full film deposition of the lead material.

Those skilled in the art understand that other known processing steps may be needed or desired in method 800, such as placing photoresists over protected regions, performing liftoff processes of unneeded material, etc.

FIG. 9 is a flow chart illustrating another method 900 of fabricating TMR ELG 400. Method 900 is described at the wafer level to fabricate a wafer of magnetic sensing devices. The magnetic sensing devices are fabricated in rows with TMR ELGs fabricated in the magnetic sensing devices, fabricated between the rows of magnetic sensing devices, or a combination of the two.

In step 902, a full film of TMR material is deposited on the wafer. In this embodiment, assume that the full film of TMR material includes a first conductive layer, a barrier layer, and a second conductive layer, although other TMR layers may also be deposited. In step 904, photoresist is placed on the TMR material for the TMR ELGs of the wafer. The photoresist may be placed on other areas of the wafer as desired, such as for the TMR elements of the magnetic sensing devices.

In step 906, the regions for the leads of the TMR ELGs are processed (e.g., milled) on a first side and a second side of each of the TMR ELGs. The regions are processed to a depth that is sufficient to expose both of the conductive layers of TMR material. The processing step 906 may further include processing trace patterns to conductive pads on one or more of the magnetic sensing devices to provide a current path to the TMR ELGs.

In step 908, a full film of lead material is deposited on the wafer. The lead material enters the milled-out regions proximate to the TMR ELGs and contacts both conductive layers of the TMR ELGs. The lead material may also enter the trace patterns for the traces between the TMR ELGs and the conductive pads. In step 910, a lift-off process is performed to remove the unneeded lead material. In step 912, the photoresist is removed.

Method 900 advantageously creates a wafer having multiple TMR ELGs as shown in FIG. 4. The TMR ELGs have leads that contact both conductive layers of the TMR stack, thus giving the TMR ELGs the advantages described herein.

Because the TMR ELGs fabricated in method 900 are formed from the same TMR material as the TMR elements, there is no need for the additional fabrication steps of forming ELGs made from non-TMR materials. This advantageously saves fabrication time and cost.

Although specific embodiments were described herein, the scope of the invention is not limited to those specific embodiments. The scope of the invention is defined by the following claims and any equivalents thereof.

We claim:

1. A tunneling magnetoresistive (TMR) electrical lapping guide (ELG), comprising:
   a TMR stack for the ELG comprising:
      a first conductive layer;
      an electrically insulating tunnel barrier layer on the first conductive layer; and
      a second conductive layer on the barrier layer;
   a first current lead that contacts the first conductive layer and contacts the second conductive layer on a first side of the TMR stack; and
   a second current lead that contacts the first conductive layer and contacts the second conductive layer on a second side of the TMR stack opposite the first side.

2. The TMR ELG of claim 1 wherein the first lead contacts the first and second conductive layers such that a potential of the first conductive layer is the same as a potential of the second conductive layer at the first side of the TMR stack.

3. The TMR ELG of claim 2 wherein the second lead contacts the first and second conductive layers such that a potential of the first conductive layer is the same as a potential of the second conductive layer at the second side of the TMR stack.

4. The TMR ELG of claim 3 wherein potentials along the length of the first conductive layer is the same as potentials along the length of the second conductive layer.

5. The TMR ELG of claim 1 where the first lead and the second lead contact the TMR stack to provide a current in plane (CIP) sense current to the TMR stack.

6. A wafer of magnetic sensing devices, the wafer comprising:
   rows of magnetic sensing devices having tunneling magnetoresistive (TMR) elements; and
   at least one TMR electrical lapping guide (ELG) comprising:
      a TMR stack comprising:
         a first conductive layer;
         a second conductive layer; and
         an electrically insulating tunnel barrier layer between the first conductive layer and the second conductive layer;
      a first current lead that contacts the first conductive layer and contacts the second conductive layer on a first side of the TMR stack; and
      a second current lead that contacts the first conductive layer and contacts the second conductive layer on a second side of the TMR stack opposite the first side.

7. The wafer of claim 6 wherein the first lead contacts the first and second conductive layers such that a potential of the first conductive layer is the same as a potential of the second conductive layer at the first side of the TMR stack.

8. The wafer of claim 7 wherein the second lead contacts the first and second conductive layers such that a potential of the first conductive layer is the same as a potential of the second conductive layer at the second side of the TMR stack.

9. The wafer of claim 8 wherein potentials along the length of the first conductive layer is the same as potentials along the length of the second conductive layer.

10. The wafer of claim 6 where the first lead and the second lead contact the TMR stack to provide a current in plane (CIP) sense current to the TMR stack.

11. The wafer of claim 6 wherein the magnetic sensing devices comprise magnetic recording heads having TMR read elements.

* * * * *